United States Patent
Lubecki et al.

(10) Patent No.: US 12,525,795 B2
(45) Date of Patent: Jan. 13, 2026

(54) POWER SUPPLY REDUNDANCY CIRCUIT

(71) Applicant: ROLLS-ROYCE plc, London (GB)

(72) Inventors: Tomasz Marek Lubecki, Singapore (SG); Apple Ang, Singapore (SG); Chee Wei Lee, Singapore (SG)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 18/738,932

(22) Filed: Jun. 10, 2024

(65) Prior Publication Data

US 2024/0421595 A1     Dec. 19, 2024

(30) Foreign Application Priority Data

Jun. 16, 2023   (GB) ...................... 2309066

(51) Int. Cl.
| | | |
|---|---|---|
| *H02J 1/08* | (2006.01) | |
| *H02J 1/10* | (2006.01) | |
| *H02J 9/06* | (2006.01) | |
| *H03K 17/30* | (2006.01) | |
| *H03K 17/687* | (2006.01) | |

(52) U.S. Cl.
CPC ............... *H02J 1/086* (2020.01); *H02J 1/10* (2013.01); *H02J 9/061* (2013.01); *H02J 9/068* (2020.01); *H03K 17/302* (2013.01); *H03K 17/6877* (2013.01)

(58) Field of Classification Search
CPC .... H02J 1/086; H02J 1/10; H02J 9/061; H02J 9/068; H03K 2017/307; H03K 17/302; H03K 17/6877

USPC .............................................. 307/18, 23, 29
See application file for complete search history.

(56) References Cited

U.S. PATENT DOCUMENTS

| | | | |
|---|---|---|---|
| 9,769,948 B2* | 9/2017 | Welch, Jr. ............... | H02J 9/062 |
| 2002/0039034 A1 | 4/2002 | Kohda | |
| 2010/0066431 A1 | 3/2010 | Carter | |
| 2018/0348264 A1 | 12/2018 | Kuo et al. | |
| 2021/0373084 A1 | 12/2021 | Thibaut et al. | |

OTHER PUBLICATIONS

Dec. 12, 2023 Combined Search and Examination Report issued in British Patent Application No. GB2309066.5.

* cited by examiner

*Primary Examiner* — Arnold M Kinkead
(74) *Attorney, Agent, or Firm* — Oliff PLC

(57) ABSTRACT

A power routing circuit having first and second input nodes VIN1, VIN2 for connection to first and second power supplies and output node VOUT1 for load connection; and includes a first main switching circuit connected between the first input node VIN1 and output node VOUT1 and conductively connects the first input node VIN1 to the output node VOUT1 if a voltage at the first input node VIN1 is higher than a voltage at the output node VOUT1, and a first auxiliary switching circuit connected between the second input node VIN2 and output node VOUT1 and conductively connects the second input node VIN2 to output node VOUT1 if a voltage at the second input node VIN2 is higher than the voltage at the output node VOUT1 and the voltage at the first input node VIN1 is at least a threshold amount lower than the voltage at the second input node VIN2.

11 Claims, 6 Drawing Sheets

POWER SUPPLY REDUNDANCY CIRCUIT

This specification is based upon and claims the benefit of priority from UK Patent Application Number 2309066.5 filed on 16 Jun. 2023, the entire contents of which are incorporated herein by reference.

BACKGROUND

Technical Field

This disclosure relates to power routing apparatuses for use in power supply systems with redundancy, and methods of the same.

Background of the Disclosure

In high-reliability electrical systems, there is often a requirement to provide redundancy in the power supply to account for power supply failure. Systems may achieve power supply redundancy by implementing two or more power supplies connected to the same load in parallel, such that if one power supply fails, the other power supply/supplies is/are able to support the load without any or substantial interruption in supplied power.

In some instances, two or more identical power supplies may be connected to the same load, wherein each power supply is capable of driving the load independently, such that if one power supply completely fails, and can no longer supply any power, another one of the power supplies (the so-called redundant power supply) can continue to drive the load at full power. Existing systems typically utilize individual fuses to each of the power supplies and/or monitor the individual power supplies using a higher-level monitoring system such as a DC-OK relay, a PLC (Programmable Logic Controller), a SCADA (Supervisory Control And Data Acquisition) system or BMS (Battery Management System).

Further, if a power supply has become damaged, or fails, due to a fault at the load, a redundant power supply which is then connected to that faulty load may similarly become damaged or fail. It is important that systems for power supply redundancy prevent unnecessary damage to the redundant power supplies.

It is desirable to provide improved power supply redundancy circuitry in the light of the above.

SUMMARY

In a first arrangement, there is provided power routing circuit having first and second input nodes VIN1, VIN2 for connection to respective first and second power supplies and an output node VOUT1 for connection to a load. The power routing circuit comprises a first main switching circuit connected between the first input node VIN1 and the output node VOUT1 and configured to conductively connect the first input node VIN1 to the output node VOUT1 if a voltage at the first input node VIN1 is higher than a voltage at the output node VOUT1, and a first auxiliary switching circuit connected between the second input node VIN2 and the output node VOUT1 and configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

The first main switching circuit may be further configured to conductively disconnect the first input node VIN1 from the output node VOUT1 if the voltage at the first input node VIN1 is lower than the voltage at the output node VOUT1.

The first auxiliary switching circuit may be further configured to conductively disconnect the second input node VIN2 from the output node VOUT1 if the voltage at the second input node VIN2 is lower than the voltage at the output node VOUT1 or the voltage at the first input node VIN1 is not at least the threshold amount lower than the voltage at the second input node VIN2.

The first main switching circuit may comprise an electronic switch SA connected between the first input node VIN1 and the output node VOUT1, and a comparator configured to compare the voltage at the first input node VIN1 with the voltage at the output node VOUT1 and to control the electronic switch SA based on the comparison.

The comparator of the first main switching circuit may comprise a first transistor Q1A, a second transistor Q2A, a first resistor R1A, a second resistor R2A, and a voltage node GND. The emitter of Q1A may be connected to VIN1, an emitter of Q2A may be connected to VOUT1, resistor R1A may be connected between a collector of Q1A and the voltage node GND, resistor R2A may be connected between a collector of Q2A and the voltage node GND, and a base of Q1A and a base of Q2A may be connected to the collector of Q1A. The voltage node GND represents a node at relatively low potential in comparison to VIN1 and VOUT1. The collector of Q2A may be connected to the electronic switch SA to control the electronic switch SA based on the comparison.

The electronic switch SA may be a field-effect transistor SA whose channel is connected between the first input node VIN1 and the output node VOUT1. The comparator of the first main switching circuit may be configured to compare the voltage at the first input node VIN1 with the voltage at the output node VOUT1 and to control the field-effect transistor SA based on the comparison. The collector of Q2A may be connected to a gate terminal of the field-effect transistor SA to control the field-effect transistor SA based on the comparison.

The first auxiliary switching circuit may comprise an electronic switch SB connected between the second input node VIN2 and the output node VOUT1. Control circuitry configured to control the electronic switch SB based on the voltage at the first input node VIN1, the voltage at the second input node VIN2 and the voltage at the output node VOUT1.

The control circuitry of the first auxiliary switching circuit may comprise a comparator configured to generate a dependent voltage VD based on the voltage at the second input node VIN2 and the voltage at the first input node VIN1, to compare the dependent voltage VD with the voltage at the output node VOUT1 and to control the electronic switch SB based on the comparison.

The comparator of the first auxiliary switching circuit may comprise a first transistor Q1B, a second transistor Q2B, a third transistor Q3B, a first resistor R1B, a second resistor R2B, a third resistor R3B, a fourth resistor R4B, a voltage node VD and a voltage node GND. An emitter of Q3B may be connected to second input node VIN2, the base of Q3B may be connected to first input node VIN1 via resistor R3B, a collector of Q3B may be connected to voltage node GND via resistor R4B, the collector of Q3B may be connected to the emitter of Q1B via the voltage node VD, an emitter of Q2B may be connected to VOUT1, resistor R1B may be connected between a collector of Q1B and the voltage node GND, resistor R2B may be connected between a collector of Q2B and the voltage node GND, and a base of Q1B and a base of Q2B may be connected to the collector of Q1B, wherein the voltage at the emitter of Q1B and at voltage node VD is the dependent voltage VD. The voltage node GND may represent a node at relatively low potential in comparison to VIN1, VIN2 and VOUT1. The collector of Q2B may be connected to the electronic switch SB to control the electronic switch SB based on the comparison.

The electronic switch SB may be a field-effect transistor SB whose channel is connected between the second input node VIN2 and the output node VOUT1. The control circuitry may be configured to control the field-effect transistor SB based on the voltage at the first input node VIN1, the voltage at the second input node VIN2 and the voltage at the output node VOUT1. The control circuitry of the first auxiliary switching circuit may comprise a comparator configured to control the field-effect transistor SB based on the comparison. The collector of Q2B may be connected to a gate terminal of the field-effect transistor SB to control the field-effect transistor SB based on the comparison.

In a second arrangement, there is provided power routing circuitry comprising a plurality of power routing circuits. Each power routing circuit may be a power routing circuit according to the first arrangement.

In a third arrangement, there is provided a power supply system with redundancy comprising the power routing circuit of the second arrangement or the power routing circuitry of the first arrangement, and a plurality of power supplies connected to respective input nodes of said power routing circuit or said power routing circuitry.

In a fourth arrangement, there is provided a switching circuit having first and second input nodes VIN1, VIN2 for connection to respective first and second power supplies and an output node VOUT1 for connection to a load. The switching circuit is configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

In a fifth arrangement, there is provided a method of routing power between first and second input nodes VIN1, VIN2 for connection to respective first and second power supplies and an output node VOUT1 for connection to a load. The method comprises conductively connecting, via a first main switching circuit connected between the first input node VIN1 and the output node VOUT1, the first input node VIN1 to the output node VOUT1 if a voltage at the first input node VIN1 is higher than a voltage at the output node VOUT1, and conductively connecting, via a first auxiliary switching circuit connected between the second input node VIN2 and the output node VOUT1, the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION OF THE DRAWINGS

Embodiments will now be described by way of example only with reference to the accompanying drawings, which are purely schematic and not to scale, and in which.

DETAILED DESCRIPTION

Figure 1:
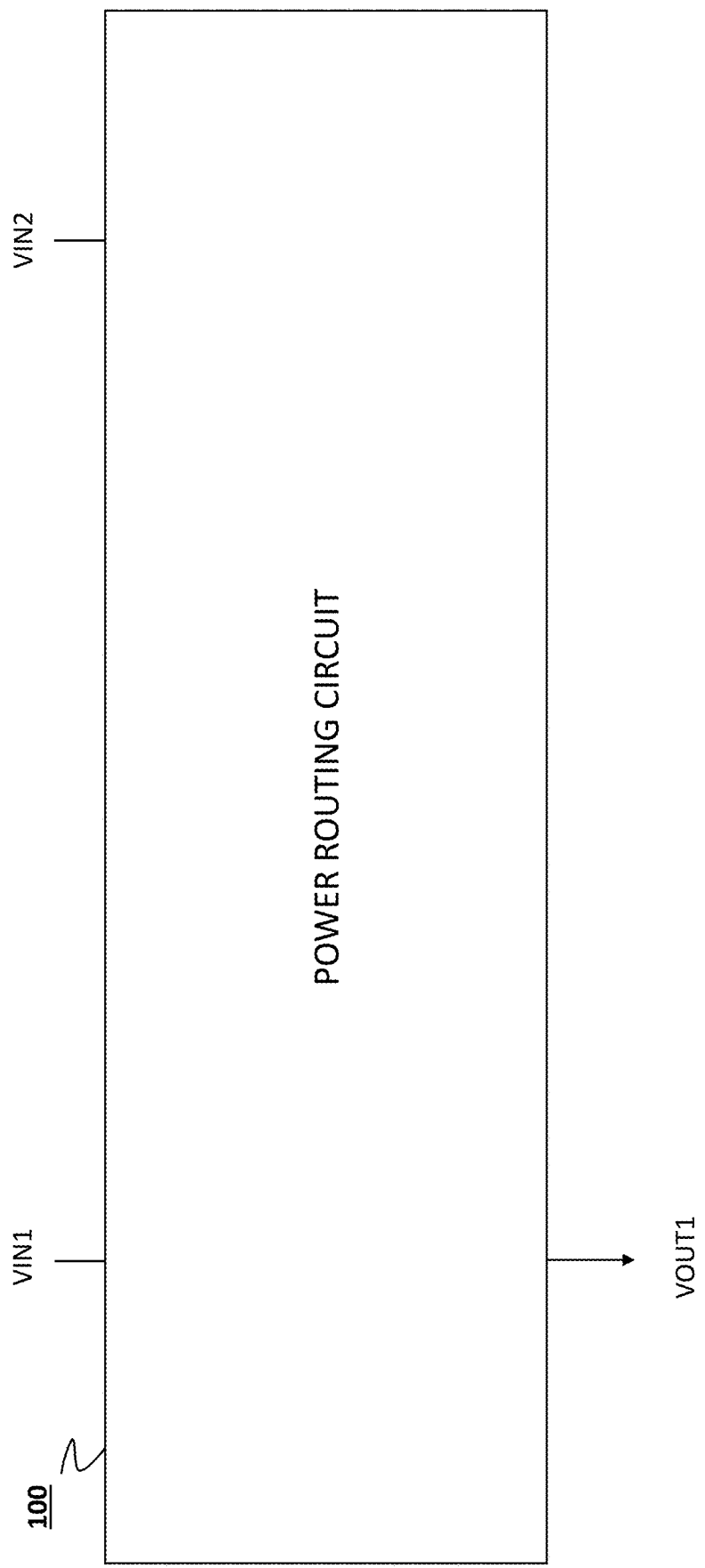
FIG. 1 is a schematic block diagram of a power routing circuit 100, embodying the present invention.

FIG. 1 is a schematic block diagram of a power routing circuit 100, embodying the present invention. Operation of the power routing circuit 100 is configured to provide power supply redundancy, and protect components connected to the power routing circuit (i.e., connected power supplies and loads) from damage. In overview, such a power routing circuit enables redundancy in power supply input between two supplies in parallel, with electronic circuits rather than fuses or higher-level systems. The elimination of fuses removes the necessity of physical intervention from the end-user to reset the system after a fault. Further, the elimination of the need for a higher-level system to monitor and control the individual power supplies simplifies overall system architecture and reduces product size and cost.

Circuit 100 comprises first and second input nodes VIN1, VIN2 for connection to respective first and second power supplies and an output node VOUT1 for connection to a load. The first and second input nodes VIN1 and VIN2 may be referred to as first and second input voltage nodes VIN1 and VIN2 respectively, and the output node VOUT1 may be referred to as a first output node VOUT1 or a first output voltage node VOUT1. For simplicity, both the first input node and a first input voltage (i.e., a voltage at the first input voltage node) will be referred to as VIN1. Similar considerations apply for VIN2 and VOUT1, as well as additional input/output nodes/voltages considered as part of the present disclosure. VIN1 and VIN2 may be supplied by corresponding power supplies VSUPPLY1 and VSUPPLY2 (not shown). VOUT1 may supply a connected load (not shown) with voltage VOUT1.

Power distribution circuit 100 controls the flow of power between the first and second input nodes VIN1 and VIN2 and the output node VOUT1.

Potential faults of such power supply systems will be considered in order to better understand the advantages of the present invention.

During normal operation, VIN1 is connected to VOUT1 via power routing circuit 100, and VIN2 is disconnected from VOUT1.

When operating within the capabilities of VIN1, a load connected to VOUT1 will draw power from VIN1 via VOUT1 and power routing circuit 100, such that the voltage at VOUT1 is less than or equal to VIN1. Hence, during regular operation, power routing circuit 100 is configured to conductively connect the first input node VIN1 to the output node VOUT1 if a voltage at the first input node VIN1 is higher than a voltage at the output node VOUT1, such that VOUT1 is supplied with power from VIN1 via power routing circuit 100.

However, different faults may occur at different locations within the system, and power routing circuit 100 is configured to identify/handle these faults and route power between the input nodes and the output node accordingly.

In a first scenario, VIN1 may decrease, such that a voltage at the first input node VIN1 is lower than a voltage at the output node VOUT1. A decrease in voltage at VIN1 (i.e., to a voltage below the rated value of VIN1) may result from VIN1 being connected to many loads (over a long period of time), and may indicate that the power supply providing VIN1 has developed a fault/degraded.

In order to continue supplying the load with (optimal/necessary/a continuous amount of) power, VIN2 should be connected to VOUT1. In order to protect the load from connection to a faulty/degraded power supply, VIN1 could be disconnected from VOUT1. Where VIN1 is disconnected from VOUT1, VIN2 should be connected to VOUT1 after VIN1 has been disconnected.

In a second scenario, VOUT1 may increase, such that a voltage at the output node is higher than a voltage at the first input node VIN1. An increase in voltage at VOUT1 (i.e., to a voltage above the rated value of VIN1) may indicate that the load has developed a fault. In order to protect the power supply supplying VIN1, VIN1 should be disconnected from VOUT1.

However, where the load has developed a fault, connecting VIN2 to VOUT1 could potentially cause VIN2 to become damaged. So, in this scenario, VIN2 should not be connected to VOUT1 (i.e., all input nodes should be disconnected from VOUT1).

Power distribution circuit 100 should therefore be configured to detect and provide appropriate functionality to connect and disconnect input voltages VIN1 and VIN2 to and from VOUT1 according to the scenarios described above.

An example implementation of power routing circuit 100 which achieves the above functionality is described below in relation to FIG. 2.

Figure 2:
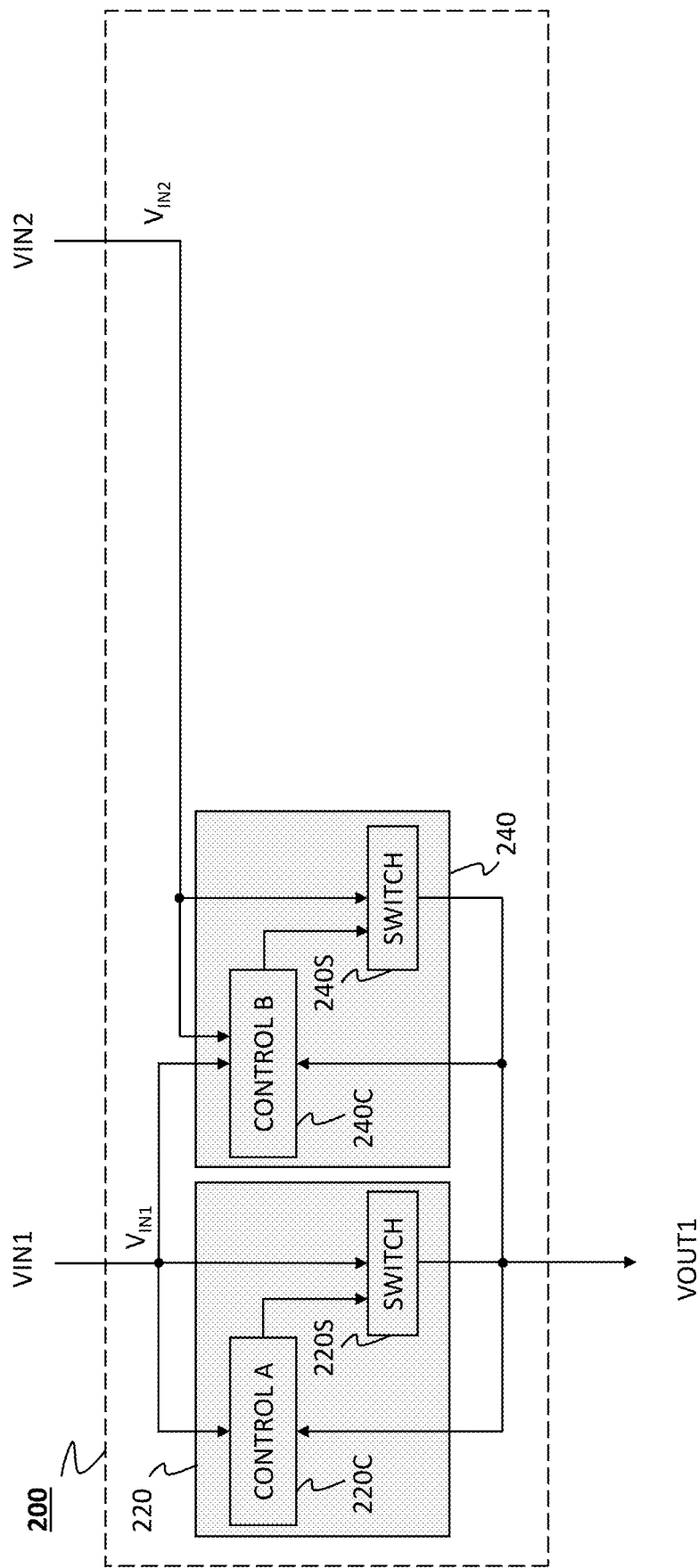
FIG. 2 is a schematic block diagram of a power routing circuit 200, embodying the present invention.

FIG. 2 is a schematic circuit diagram of power routing circuit 200, embodying the present invention.

Power routing circuit 200 comprises first and second input nodes VIN1, VIN2 for connection to respective first and second power supplies and an output node VOUT1 for connection to a load as described in relation to FIG. 1. Repeat description will be omitted.

Power routing circuit 200 also comprises a (first) main switching circuit 220, comprising Control A unit 220C and switch 220S, and a (first) auxiliary switching circuit 240, comprising Control B unit 240C and switch 240S.

Control A unit 220C is connected to VIN1, VOUT1 and switch 220S. Switch 220S is also connected to VIN1 and VOUT1. Control B unit 240C is connected to VIN1, VIN2, VOUT1 and switch 240S. Switch 240S is also connected to VIN2 and VOUT1.

First main switching circuit 220 is connected between the first input node VIN1 and the output node VOUT1 and configured to conductively connect the first input node VIN1 to the output node VOUT1 if a voltage at the first input node VIN1 is higher than a voltage at the output node VOUT1.

In one arrangement, the first main switching circuit 220 is further configured to conductively disconnect the first input node VIN1 from the output node VOUT1 if the voltage at the first input node VIN1 is lower than the voltage at the output node VOUT1.

First auxiliary switching circuit 240 is connected between the second input node VIN2 and the output node VOUT1 and configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

In one arrangement, the first auxiliary switching circuit 240 is further configured to conductively disconnect the second input node VIN2 from the output node VOUT1 if the voltage at the second input node VIN2 is lower than the voltage at the output node VOUT1 or the voltage at the first input node VIN1 is not at least the threshold amount lower than the voltage at the second input node VIN2.

Figure 4:
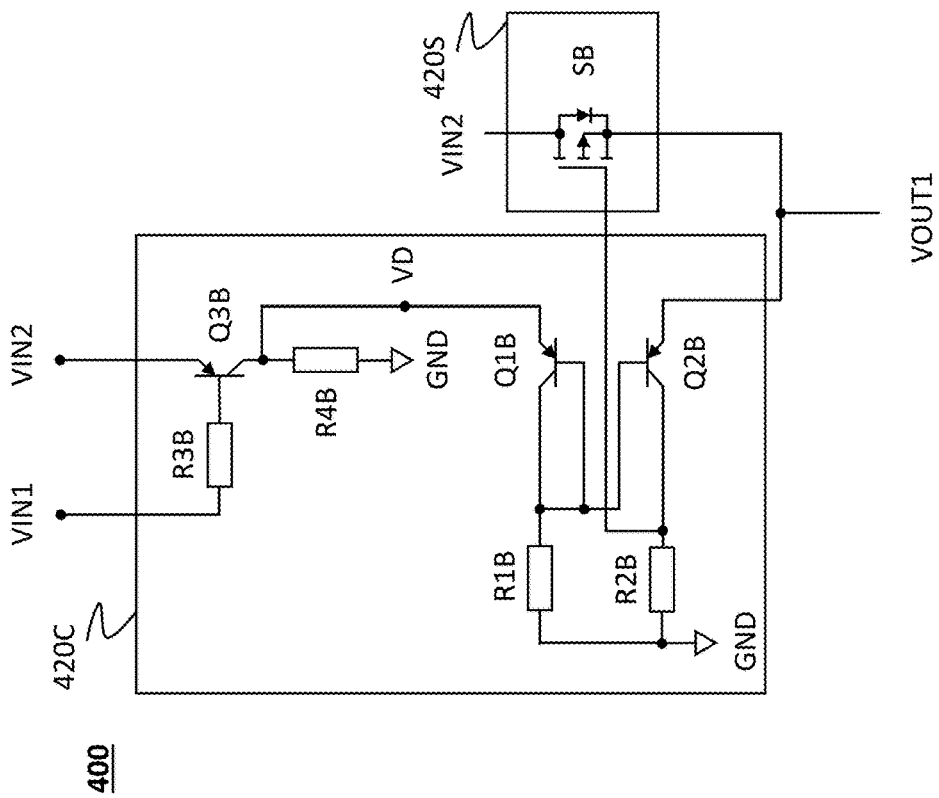
FIG. 4 is a schematic diagram of switching circuitry 400.
Figure 3:
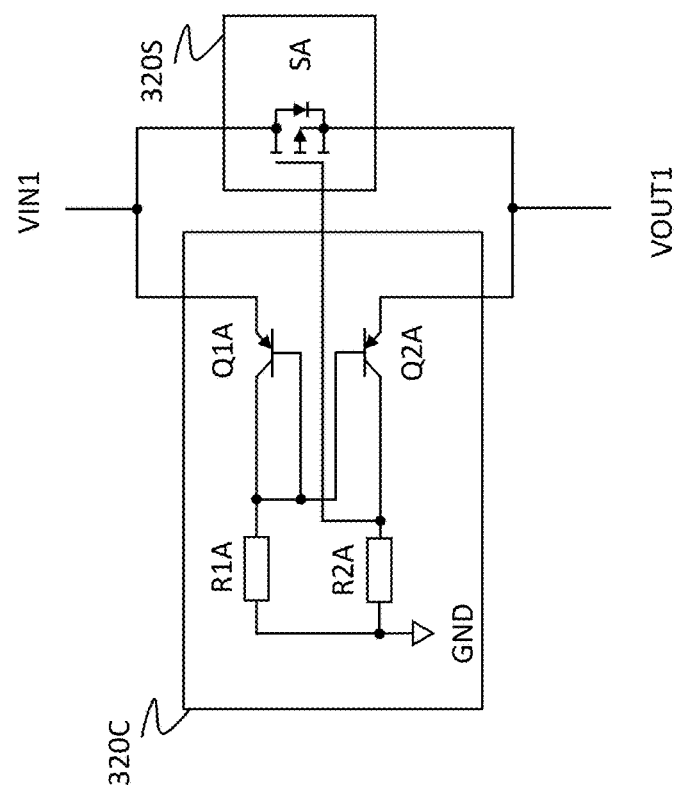
FIG. 3 is a schematic diagram of switching circuitry 300.

The function of Control A unit 220C and switch 220S will be considered in more detail with reference to FIG. 3, and the function of Control B unit 240C and switch 240S will be considered in more detail with reference to FIG. 4.

FIG. 3 is a schematic diagram of switching circuitry 300 which is an example configuration of main switching circuit 220 in FIG. 2.

Switching circuitry 300 may be considered an ideal diode (i.e., a circuit implementation intended to simulate as close as possible the properties of an ideal diode), and represents switching circuitry comprising a comparator 320C and a switch 320S, the switching circuitry 300 configured to cause the switch 320S to close (i.e., conduct) in a first configuration where an input voltage is larger than an output voltage, and which causes the switch 320S to open (i.e., not conduct) in a second configuration where the input voltage is smaller than the output voltage.

The switching circuitry 300 comprises an input node receiving input voltage VIN1 and an output node receiving output voltage VOUT1. VIN1 and VOUT1 correspond to VIN1 and VOUT1 of FIG. 2 and repeat description will be omitted.

The switching circuitry 300 further comprises transistor Q1A, resistor R1A, transistor Q2A, resistor R2A and an electronic switch SA. Transistors Q1A and Q2A may be implemented as BJTs. Q1A, Q2A, R1A and R2A may collectively be referred to as comparator 320C, equivalent to Control A unit 220C in FIG. 2. Electronic switch SA may be referred to as switch 320S, equivalent to switch 220S in FIG. 2.

Switch 320S comprises the electronic switch SA. Switching circuitry 300 shows electronic switch SA implemented as MOSFET SA, however it will be understood that the switching behaviour and connectivity of the electronic switch SA, described herein with reference to the gate, source, drain terminals, and channel, of the MOSFET SA, may be implemented by other types of electronic switching devices. That is, MOSFET SA is one example of the electronic switch SA. Other electronic switches of the present disclosure, e.g., electronic switch SB (exemplified in FIG. 4 as MOSFET SB), should be understood accordingly. Continuing with the example arrangement shown in FIG. 3, MOSFET SA is field-effect transistor whose channel is connected between the first input node VIN1 and the output node VOUT1, and which is connected and driven in the reverse direction, with the drain terminal connected to VIN1 and the source terminal connected to VOUT1. In this orientation, the MOSFET body diode is oriented such that the anode of the body diode is connected to VIN1 (via the drain terminal) and the cathode of the body diode is connected to VOUT1 (via the source terminal). A gate of MOSFET SA is connected to the collector of Q2A.

Comparator 320C is configured to compare the voltage at the first input node VIN1 with the voltage at the output node VOUT1 and to control the field-effect transistor (MOSFET SA) based on the comparison. An emitter of Q1A is connected to VIN1 and an emitter of Q2A is connected to VOUT1. Resistor R1A is connected between a collector of Q1A and a voltage node GND, and resistor R2A is connected between the collector of Q2A and the voltage node GND. Voltage node GND may represent a node at ground potential, or a relatively low potential in comparison to VIN1 and VOUT1. The base of Q1A and the base of Q2A are connected to the collector of Q1A.

Q1A, Q2A and MOSFET SA are all p-type switches. Of course, a similar circuit may be constructed from n-type switches, and the skilled person would be aware of the necessary modifications to the circuit in order to achieve comparable operation.

The function of switching circuitry 300 may be understood by considering operation at particular values of VIN1 and VOUT1.

In a first example, the voltage VIN1 is LO (OFF, −VCC, 0 v, −1 v, −2 v, −5 v etc.) and the voltage at VOUT1 is HI (ON, VCC, +1 v, +2 v, +5 v etc.). The first example represents a situation where the input power supply has failed/degraded, and the voltage seen over the load is higher than that supplied by the power supply connected to VIN1.

When VIN1 is LO, the voltage at the emitter of Q1A is low, and since VOUT1 is HI, the voltage at the emitter of Q2A is high. The low voltage at the emitter of Q1A means that Q1A will not conduct, preventing current from flowing from VIN1 to R1A. The high voltage at the emitter of Q2A means that Q2A will conduct, allowing current to flow from VOUT1 to R2A. Since no current may flow from VIN1 to R1A through Q1A, no, or a very low, voltage will appear over R1A, supplying a low voltage to the base of Q2A, allowing Q2A to conduct. While a low voltage is also supplied to the base of Q1A, the emitter-base voltage does not overcome the threshold voltage of the emitter-base diode of Q1A, and so no current may flow. Current flowing from VOUT1 to R2A through Q2A will cause a high voltage to appear over R2A, supplying a high voltage to the gate terminal of MOSFET SA, turning the MOSFET SA off to prevent/reduce current flow. Turning MOSFET SA off prevents current flow from VOUT1 to VIN1.

Therefore, when VIN1 is smaller than VOUT1, the switching circuitry 300 operates to turn MOSFET SA off.

In a second example, the voltage at VIN1 is HI (ON, VCC, +1 v, +2 v, +5 v etc.) and the voltage at VOUT1 is LO (OFF, −VCC, 0 v, −1 v, −2 v, −5 v etc.). The second example represents a situation where the load is not drawing power, or the load is operating within the maximum operating voltage of the power supply, where the voltage seen over the load is lower than that supplied by the power supply connected to VIN1.

When VIN1 is HI, the voltage at the emitter of Q1A is high, and since VOUT1 is LO, the voltage at the emitter of Q2A is low. The high voltage at the emitter of Q1A means that Q1A will conduct, allowing current to flow from VIN1 to R1A. The low voltage at the emitter of Q2A means that Q2A will not conduct, preventing current from flowing from VOUT1 to R2A. Current flowing from VIN1 to R1A through Q1A will cause a high voltage to appear over R1A, supplying a high voltage to the base terminals of Q1A and Q2A, preventing Q2A from conducting. While a high voltage is also supplied to the base of Q1A, the emitter-base voltage does overcome the threshold voltage of the emitter-base diode of Q1A, and so current may flow through Q1A. Since no current may flow from VOUT1 to R2A through Q2A, no, or a very low, voltage will appear over R2A, supplying a low voltage to the gate terminal of the MOSFET SA, turning the MOSFET SA on to allow current flow from VIN1 to VOUT1.

Therefore, when VIN1 is larger than VOUT1, the switching circuitry 300 operates to turn MOSFET SA on.

It may be appreciated that while operation at extreme values of VIN1 and VOUT1 have been used for simplicity, similar operation will occur depending on analogue values of VIN1 and VOUT1.

For example, when VIN1 is slightly higher than VOUT1, Q1A will conduct more current and Q2A will conduct less current. More current flowing through Q1A will cause the voltage over R1A to increase, subsequently increasing the voltage at the base of Q2A, preventing current flowing through Q2A. The imbalance in voltage between VIN1 and VOUT1 is thus amplified by the control circuitry 320C, which may be considered as a voltage comparator. As VOUT1 increases towards the value of VIN1, MOSFET SA will continue to conduct until the difference in voltage between VIN1 and VOUT1 causes a voltage capable of switching the MOSFET SA off to be seen at the gate terminal of MOSFET SA (i.e., a sufficiently high voltage is seen over R2A), preventing current flow. In practice, when MOSFET SA is on, allowing current to flow, a small voltage drop will be seen over the MOSFET SA due to the on-resistance of the MOSFET SA, causing a slight imbalance between VIN1 and VOUT1, however operation of FIG. 3 will be understood to only cause switching of the MOSFET SA when the imbalance (between VIN1 and VOUT1) is greater than a voltage necessary to turn the MOSFET SA off.

Where VIN1 and VOUT1 are equivalent (i.e., are the same voltage, or at substantially the same voltage level), the switching circuitry operates to turn MOSFET SA on to allow current flow (since the difference between VIN1 and VOUT1 is not sufficient to turn MOSFET SA off).

Switching circuitry 300 can thus be considered an ideal diode, in that current may flow from VIN1 to VOUT1 when voltage VIN1 is greater than VOUT1 since SA is on, and in that current may not flow from VOUT1 to VIN1 when VOUT1 is greater than VIN1 since SA is off. Switching circuitry 300 therefore connects VIN1 to VOUT1 when VIN1 is higher than VOUT1, and disconnects VIN1 from VOUT1 when VIN1 is smaller than VOUT1.

FIG. 4 is a schematic diagram of switching circuitry 400 which is an example configuration of auxiliary switching circuit 240 in FIG. 2.

Similarities between switching circuitry 400 and switching circuitry 300 will be readily apparent from a comparison of FIGS. 3 and 4. Where possible, like elements have been denoted using corresponding like reference signs.

Switching circuitry 400 may also be considered an ideal diode, and represents switching circuitry comprising a comparator 420C and a switch 420S, the switching circuitry 400 configured to cause the switch 420S to close in a first configuration where a dependent voltage VD is larger than an output voltage VOUT1, and which causes the switch 420S to open in a second configuration where the dependent voltage VD is smaller than the output voltage VOUT1.

Transistor Q1B, transistor Q2B, resistor R1B, resistor R2B, electronic switch SB, output node VOUT1 and voltage node GND of switching circuitry 400 correspond to transistor Q1A, transistor Q2A, resistor R1A, resistor R2A, electronic switch SA, output node VOUT1 and voltage node GND of switching circuitry 300. These elements of FIG. 4 are configured as described in relation to FIG. 3 and repeat description will be omitted. Voltage node GND may represent a node at ground potential, or a relatively low potential in comparison to VIN1, VIN2 and VOUT1.

However, there are a number of differences between switching circuitry 400 and switching circuitry 300 which will be described below.

Switch 420S comprises the electronic switch SB. Switching circuitry 400 shows electronic switch SB implemented as a MOSFET SB. MOSFET SB is a field-effect transistor whose channel is connected between the second input node VIN2 and the output node VOUT1 (instead of the first input node VIN1 and the output node VOUT1 as per MOSFET SA), and which is connected and driven in the reverse direction, with the drain terminal connected to VIN2 and the source terminal connected to VOUT1. In this orientation, the MOSFET body diode is oriented such that the anode of the body diode is connected to VIN2 (via the drain terminal) and the cathode of the body diode is connected to VOUT1 (via the source terminal). A gate of MOSFET SB is connected to the collector of Q2B.

Comparator 420C comprises additional circuit elements transistor Q3B, resistor R3B and resistor R4B. Transistor Q3B may be implemented as a BJT. The emitter of Q3B is connected to second input node VIN2 and the base of Q3B is connected to first input node VIN1 via resistor R3B. The collector of Q3B is connected to voltage node GND via resistor R4B, and the collector of Q3B is also connected to the emitter of Q1B via node VD. The voltage over resistor R3B (and seen at node VD and the collector of Q3B) is the dependent voltage VD.

Comparator 420C is configured to generate a dependent voltage VD based on the voltage at the second input node VIN2 and the voltage at the first input node VIN1, to compare the dependent voltage VD with the voltage at the output node VOUT1 and to control the field-effect transistor (MOSFET SB) based on the comparison.

The function of the additional circuit elements of comparator 420C is to determine whether VIN1 is at least a threshold (voltage) amount lower than VIN2, and to output a dependent voltage VD (to node VD) accordingly. Operation of the additional circuit elements of comparator 420C may be understood by considering operation at particular values of VIN1 and VIN2.

In a first example, the voltage at VIN1 is LO and the voltage at VIN2 is HI. This example represents a situation where the power supply supplying VIN1 has failed/degraded and the voltage at VIN1 has dropped below a threshold voltage amount relative to VIN2, and where the power supply supplying VIN2 is operating normally.

When VIN1 is LO, a low voltage is seen at the base of Q3B, and a high voltage is seen at the emitter of Q3B, allowing Q3B to conduct. Current flowing from VIN2 to R4B through Q3B will cause a high voltage to appear over R4B, supplying a high dependent voltage VD to the emitter of Q1B via node VD.

Operation of the remaining parts of the switching circuitry 400 will follow the description given in relation to FIG. 3, where the node VD (at the emitter of Q1B) can be compared with an equivalent node (receiving VIN1) at the emitter of Q1A. That is, whereas the comparator 320C is controlled by VIN1 and VOUT1, the equivalent operation of comparator 420C is controlled by VD and VOUT1.

In a second example, the voltage at VIN1 is HI and the voltage at VIN2 is HI. This example represents a situation where the power supply supplying VIN1 and the power supply supplying VIN2 are both operating normally, and there is no reason to connect VOUT1 to VIN2.

When VIN1 is HI, a high voltage is seen at the base of Q3B, preventing Q3B from conducting (since the emitter-base threshold is not overcome). Since current is prevented from flowing from VIN2 to R4B through Q3B, no, or a very small, voltage will appear over R4B, supplying a low dependent voltage VD to the emitter of Q1B via node VD.

Operation of the remaining parts of the switching circuitry 400 will follow the description given in relation to FIG. 3, similarly as above.

The additional circuit elements of comparator 420C (only) turn the MOSFET SB on (allowing SB to conduct) when a difference between VIN1 (seen at the base terminal of Q3B) and VIN2 (seen at the emitter of Q3B) is greater than a predetermined threshold (set by the values of R3B and the threshold voltage of the emitter-base diode of the transistor Q3B), indicating that VIN1 has fallen a threshold amount lower than VIN2, and when the dependent voltage VD is smaller than VOUT. By turning on MOSFET SB, allowing current to flow, VOUT1 is connected to VIN2, allowing VIN2 to supply VOUT1 with power.

The additional circuit elements of comparator 420C effectively turn MOSFET SB off (preventing SB from being able to conduct) when a difference between VIN1 and VIN2 is not greater than the predetermined threshold, indicating that VIN1 has not fallen a threshold amount lower than VIN2, and indicating that the power supplies supplying VIN1 and VIN2 are operating normally (or close to normally), and when VOUT1 is higher than VIN2. By turning MOSFET SB off (preventing current flow from VIN2 to VOUT1), VIN2 remains disconnected from VOUT1.

The predetermined threshold (the threshold difference in voltage between VIN1 and VIN2) may be set relative to the rated voltage level of the power supplies connected to input nodes VIN1 and VIN2. For example, the threshold may be set at 90% of the rated output voltage of the power supply supplying VIN2 with power, such that the threshold is exceeded when VIN1 drops below 90% of the rated output voltage of the power supply supplying VIN2. Of course, 90% is merely an example, and may be any percentage value, or ratio between VIN1 and VIN2. In another example, the threshold voltage may be a set voltage amount i.e., 1V, 3V, 10V etc.

Figure 5:
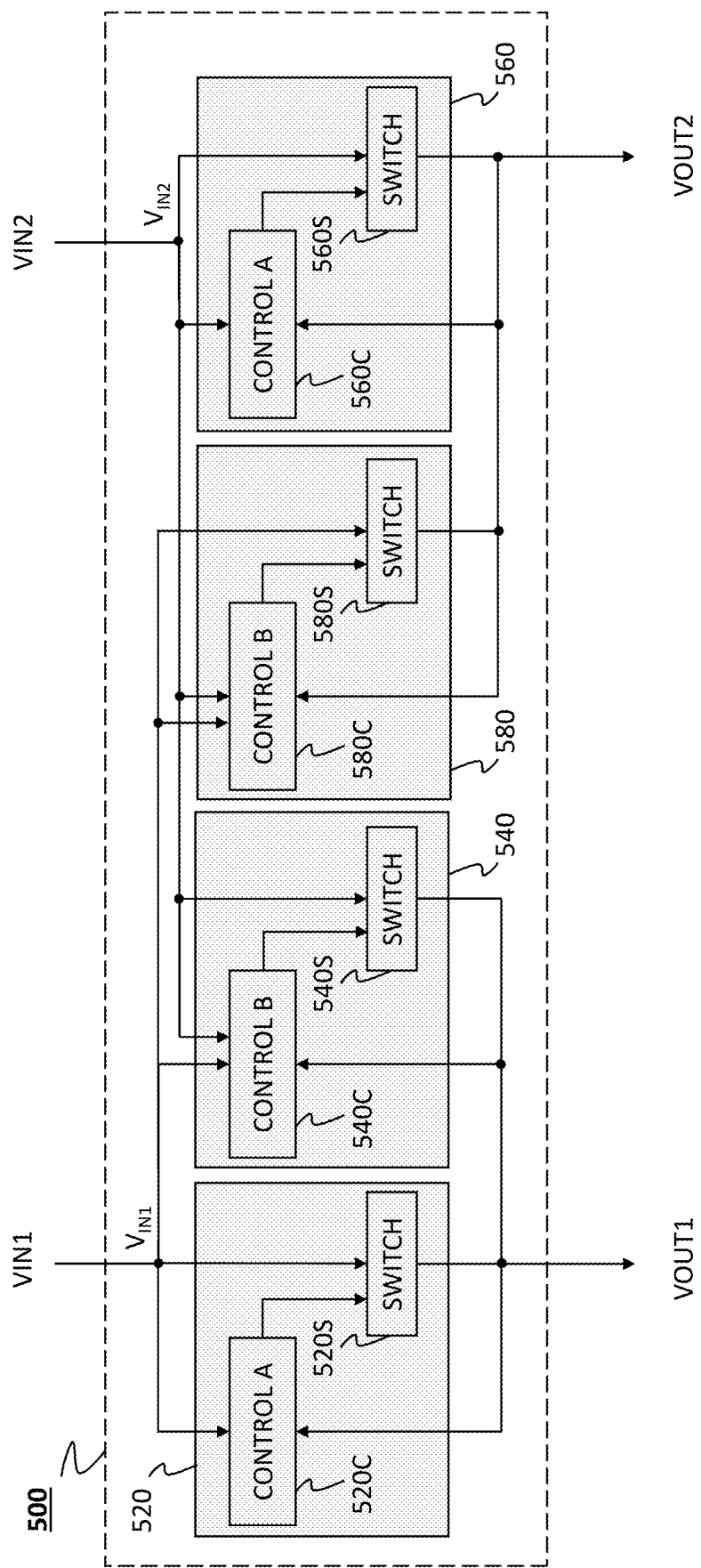
FIG. 5 is a schematic block diagram of a power routing circuit 500, embodying the present invention.

FIG. 5 is a schematic diagram of power routing circuit 500, embodying the present invention. Circuit 500 is a further example of the power routing circuit 100 of FIG. 1. Similarities between power routing circuit 200 and power routing circuit 500 will be apparent from a comparison of FIGS. 2 and 5.

Where possible, like elements have been denoted using corresponding like reference signs. Power routing circuit 500 comprises first and second input nodes VIN1 and VIN2, and a first output node VOUT1 configured as described in relation to FIG. 1. Repeat description will be omitted.

Power routing circuit 500 also comprises a first main switching circuit 520 comprising Control A unit 520C and switch 520S, and a first auxiliary switching circuit 540 comprising Control B unit 540C and switch 540S. First main switching circuit 520 and first auxiliary switching circuit 540 are configured in the same way as main switching circuit 220 and auxiliary switching circuit 240 as described in relation to FIG. 2. Control A unit 520C, switch 520S, Control B unit 540C and switch 540S correspond to Control A unit 220C, switch 220S, Control B unit 240C and switch 240S respectively, and so repeat description will be omitted.

Power routing circuit 500 further comprises a second output node VOUT2, second main switching circuit 560 comprising Control A unit 560C and switch 560S, and a second auxiliary switching circuit 580 comprising Control B unit 580C and switch 580S.

As can be appreciated from FIG. 2, the main switching circuit 220 and the auxiliary switching circuit 240 are configured to connect or disconnect two input nodes (VIN1 and VIN2) and one output node (VOUT1). Second main switching circuit 560 and second auxiliary switching circuit 580 may be considered as a corresponding main switching circuit 220 and a corresponding auxiliary switching circuit 240 configured to connect or disconnect two input nodes (VIN1 and VIN2) from an additional, other, second output node (VOUT2). The second main switching circuit 560 and second auxiliary switching circuit 580 are effectively copies/duplicates of first main switching circuit 520 and first auxiliary switching circuit 540 respectively, necessary to provide the same switching functionality for VOUT2 (i.e., between the inputs VIN1 and VIN2 and output VOUT2) as that previously described in relation to FIG. 2 for VOUT1.

Generally, where the first main switching circuit 520 relates to connecting or disconnecting VIN1 and VOUT1, and the first auxiliary switching circuit 540 relates to connecting or disconnecting VIN2 and VOUT1, the second main switching circuit 560 relates to connecting or disconnecting VIN2 and VOUT2, and the second auxiliary switching circuit 580 relates to connecting or disconnecting VIN1 and VOUT2.

Control A unit 560C is connected to VIN2, VOUT2 and switch 560S. Switch 560S is also connected to VIN2 and VOUT2. Control B unit 580C is connected to VIN1, VIN2, VOUT2 and switch 580S. Switch 580S is also connected to VIN1 and VOUT2.

The function of Control A unit 560C and switch 560S aligns with the description given in respect of FIG. 3, however the input voltage is VIN2 instead of VIN1, and the output voltage is VOUT2 instead of VOUT1. Second main switching circuitry 560 effectively connects VIN2 to VOUT2 when VIN2 is larger than VOUT2, and may disconnect VOUT2 from VIN2 when VIN2 is smaller than VOUT2.

The function of Control B unit 580C and switch 580S aligns with the description given in respect of FIG. 4, however the input voltage connected to the emitter of Q3B is VIN1 instead of VIN2, the input voltage connected to R3B is VIN2 instead of VIN1, the input voltage connected to the drain of MOSFET SB is VIN1 instead of VIN2, and the output voltage is VOUT2 instead of VOUT1.

The power distribution circuit 500 thus provides increased switching capability between multiple inputs (dual inputs in the arrangement of FIG. 5) and multiple outputs (dual outputs in the arrangement of FIG. 5), and can provide power supply redundancy to multiple output nodes (and thus multiple loads).

Figure 6:
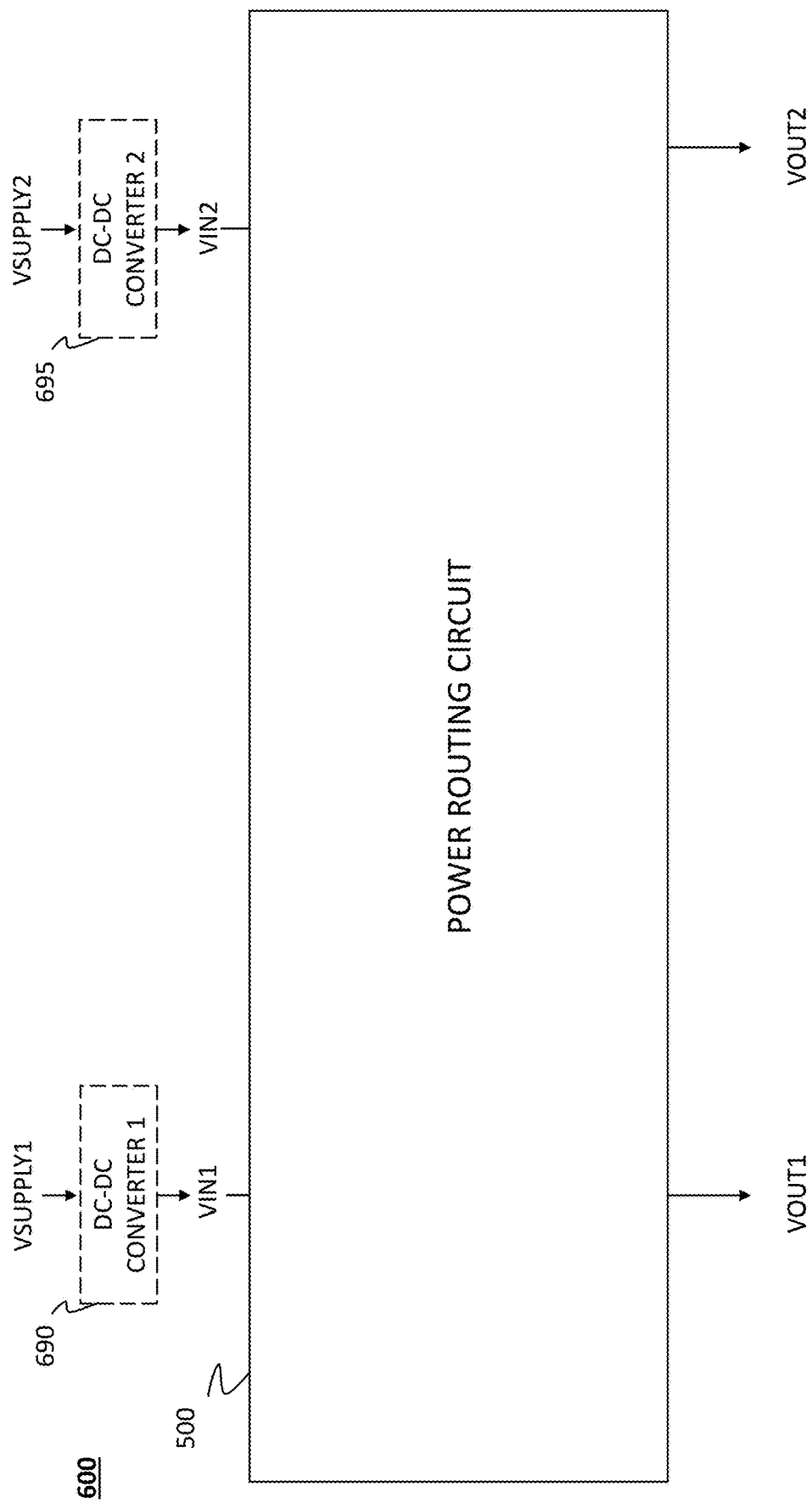
FIG. 6 is a schematic block diagram of power supply with redundancy 600, embodying the present invention.

FIG. 6 is a schematic block diagram of power supply with redundancy 600, embodying the present invention.

Power supply with redundancy 600 comprises power routing circuit 500, a first power supply VSUPPLY1 and a second power supply VSUPPLY2. First and second power supplies VSUPPLY1 and VSUPPLY2 are connected to input voltage nodes VIN1 and VIN2 of power routing circuit 500 respectively, and are power supplies configured to output first and second voltages VSUPPLY1 and VSUPPLY2 respectively. VSUPPLY1 and VSUPPLY2 may be rated at (at least) twice the rated value of VIN1 or VIN2, such that if one power supply were to completely fail, the remaining power supply could supply power to both VOUT1 and VOUT2.

Optionally, first and second power supplies VSUPPLY1 and VSUPPLY2 may supply first and second voltages VSUPPLY1 and VSUPPLY2 to power routing circuit 500 via first and second DC-DC converters 690 and 695 respectively. DC-DC converters 690 and 695 may be configured to increase (step up) or decrease (step down) first and second voltages VSUPPLY1 and VSUPPLY2 prior to first and second input voltage nodes VIN1 and VIN2 of power routing circuit 500.

While the arrangement of FIG. 6 has been shown comprising power routing circuit 500, it should be understood that any power routing circuit 100, 200 or 500 may be implemented as part of power supply with redundancy 600.

Figure 7:
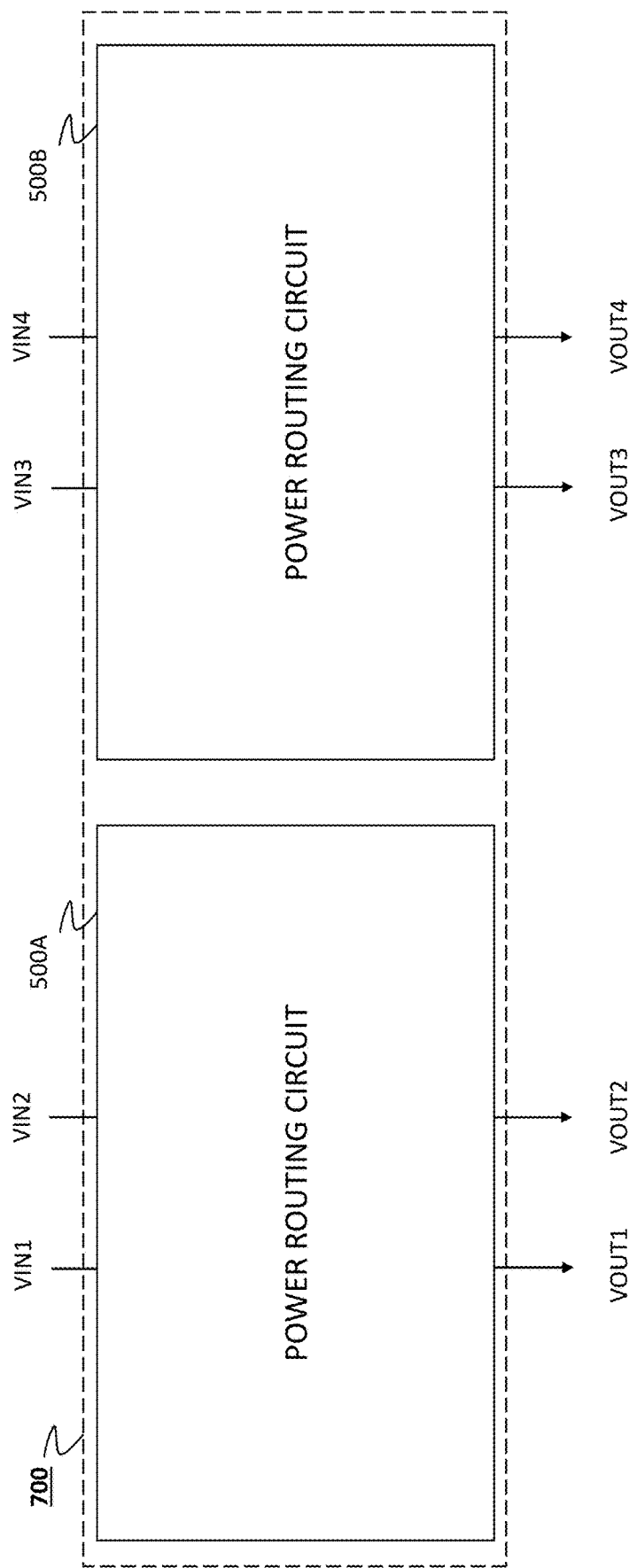
FIG. 7 is a schematic block diagram of power routing circuitry 700, embodying the present invention.

FIG. 7 is a schematic block diagram of power routing circuitry 700.

Power routing circuitry 700 comprises a first power routing circuit 500A with input nodes VIN1 and VIN2, and output nodes VOUT1 and VOUT2, and a second power routing circuit 500B with input nodes VIN3 and VIN4, and output nodes VOUT3 and VOUT4.

Operation of power routing circuits 500A and 500B are identical to the operation described with respect to power routing circuit 500 described above. Power routing circuits 500A and 500B may each be considered an instance of power routing circuit 500. Thus, operation of second power routing circuit 500B may be understood by comparing nodes VIN3, VIN4, VOUT3 and VOUT4 with nodes VIN1, VIN2, VOUT1 and VOUT2, respectively.

It should be understood that power routing circuitry 700 may comprise any number of power routing circuits, each with their own set of input voltages and output voltages for connection to a large number of power supplies and loads, respectively. The configuration shown in FIG. 7 (and other configurations comprising N power routing circuits, where N>2) ensures that every output node of a particular power routing circuit can be connected to and disconnected from to at least two input nodes, providing redundancy in the event of a failure at one of the input nodes of that particular power routing circuit.

While the arrangement of FIG. 7 has been shown comprising (multiple instances of) power routing circuit 500, it should be understood that any power routing circuit 100, 200 or 500 may be implemented as part of power routing circuitry 700.

Various examples have been described, each of which feature various combinations of features. It will be appreciated by those skilled in the art that, except where clearly mutually exclusive, any of the features may be employed separately or in combination with any other features and the invention extends to and includes all combinations and sub-combinations of one or more features described herein.

It will also be appreciated that the techniques described herein could be used for many applications. These include, but are not limited to aerospace, automotive, marine, sub-marine and land-based applications with power systems. Alternatively, the techniques described herein may be applied to power systems in general i.e., containerised battery systems, or power banks, comprising more than one form of power supply (more than one battery etc.), used to supply power to any type of electrical system. Such containerised battery systems or power banks (power supply or containerized power supply) may be implemented in aerospace, automotive, marine, sub-marine, and land-based applications as described above.

The disclosure extends to the below numbered sets of statements:

X1. A power routing circuit having first and second input nodes VIN1, VIN2 for connection to respective first and second power supplies and an output node VOUT1 for connection to a load, the power routing circuit comprising:
- a first main switching circuit connected between the first input node VIN1 and the output node VOUT1 and configured to conductively connect the first input node VIN1 to the output node VOUT1 if a voltage at the first input node VIN1 is higher than a voltage at the output node VOUT1; and
- a first auxiliary switching circuit connected between the second input node VIN2 and the output node VOUT1 and configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

X2. The power routing circuit of statement X1, wherein the first main switching circuit is further configured to conductively disconnect the first input node VIN1 from the output node VOUT1 if the voltage at the first input node VIN1 is lower than the voltage at the output node VOUT1.

X3. The power routing circuit of statement X1 or X2, wherein the first auxiliary switching circuit is further configured to conductively disconnect the second input node VIN2 from the output node VOUT1 if the voltage at the second input node VIN2 is lower than the voltage at the output node VOUT1 or the voltage at the first input node VIN1 is not at least the threshold amount lower than the voltage at the second input node VIN2.

X4. The power routing circuit of any of the preceding statements wherein the first main switching circuit comprises an electronic switch SA connected between the first input node VIN1 and the output node VOUT1, and a comparator configured to compare the voltage at the first input node VIN1 with the voltage at the output node VOUT1 and to control the electronic switch SA based on the comparison.

X5. The power routing circuit of statement X4, wherein:
the comparator of the first main switching circuit comprises a first transistor Q1A, a second transistor Q2A, a first resistor R1A, a second resistor R2A, and a voltage node GND, wherein the emitter of Q1A is connected to VIN1, an emitter of Q2A is connected to VOUT1, resistor R1A is connected between a collector of Q1A and the voltage node GND, resistor R2A is connected between a collector of Q2A and the voltage node GND, and a base of Q1A and a base of Q2A are connected to the collector of Q1A;
the voltage node GND represents a node at relatively low potential in comparison to VIN1 and VOUT1; and
the collector of Q2A is connected the electronic switch SA to control the electronic switch SA based on the comparison.

X6. The power routing circuit of statement X4 or X5, wherein:
the electronic switch SA is a field-effect transistor SA whose channel is connected between the first input node VIN1 and the output node VOUT1; and
the comparator of the first main switching circuit is configured to compare the voltage at the first input node VIN1 with the voltage at the output node VOUT1 and to control the field-effect transistor SA based on the comparison,
optionally wherein the collector of Q2A is connected to a gate terminal of the field-effect transistor SA to control the field-effect transistor SA based on the comparison.

X7. The power routing circuit of any of the preceding statements, wherein the first auxiliary switching circuit comprises an electronic switch SB connected between the second input node VIN2 and the output node VOUT1, and control circuitry configured to control the electronic switch SB based on the voltage at the first input node VIN1, the voltage at the second input node VIN2 and the voltage at the output node VOUT1.

X8. The power routing circuit of statement X7, wherein the control circuitry of the first auxiliary switching circuit comprises a comparator configured to generate a dependent voltage VD based on the voltage at the second input node VIN2 and the voltage at the first input node VIN1, to compare the dependent voltage VD with the voltage at the output node VOUT1 and to control the electronic switch SB based on the comparison.

X9. The power routing circuit of statement X8, wherein:
the comparator of the first auxiliary switching circuit comprises a first transistor Q1B, a second transistor Q2B, a third transistor Q3B, a first resistor R1B, a second resistor R2B, a third resistor R3B, a fourth resistor R4B, a voltage node VD and a voltage node GND, wherein an emitter of Q3B is connected to second input node VIN2, the base of Q3B is connected to first input node VIN1 via resistor R3B, a collector of Q3B is connected to voltage node GND via resistor R4B, the collector of Q3B is connected to the emitter of Q1B via the voltage node VD, an emitter of Q2B is connected to VOUT1, resistor R1B is connected between a collector of Q1B and the voltage node GND, resistor R2B is connected between a collector of Q2B and the voltage node GND, and a base of Q1B and a base of Q2B are connected to the collector of Q1B, wherein the voltage at the emitter of Q1B and at voltage node VD is the dependent voltage VD;
the voltage node GND represents a node at relatively low potential in comparison to VIN1, VIN2 and VOUT1; and
the collector of Q2B is connected to the electronic switch SB to control the electronic switch SB based on the comparison.

X10. The power routing circuit of any of statements X7 to X9, wherein:
the electronic switch SB is a field-effect transistor SB whose channel is connected between the second input node VIN2 and the output node VOUT1; and
the control circuitry is configured to control the field-effect transistor SB based on the voltage at the first input node VIN1, the voltage at the second input node VIN2 and the voltage at the output node VOUT1,
optionally wherein the comparator is configured to control the field-effect transistor SB based on the comparison,
and further optionally wherein the collector of Q2B is connected to a gate terminal of the field-effect transistor SB to control the field-effect transistor SB based on the comparison.

X11. Power routing circuitry comprising a plurality of power routing circuits, each power routing circuit being a power routing circuit according to any of statements X1 to X10.

X12. A power supply system with redundancy comprising the power routing circuit of any of statements X1 to X10 or the power routing circuitry of statement X11, and a plurality of power supplies connected to respective input nodes of said power routing circuit or said power routing circuitry.

Y1. A switching circuit having first and second input nodes VIN1, VIN2 for connection to respective first and second power supplies and an output node VOUT1 for connection to a load, the switching circuit configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

Y2. The switching circuit of statement Y1, wherein the switching circuit is further configured to conductively disconnect the second input node VIN2 from the output node VOUT1 if the voltage at the second input node VIN2 is lower than the voltage at the output node VOUT1 or the voltage at the first input node VIN1 is not at least the threshold amount lower than the voltage at the second input node VIN2.

Y3. The switching circuit of statement Y1 or Y2, wherein the switching circuit comprises an electronic switch SB whose channel is connected between the second input node VIN2 and the output node VOUT1, and control circuitry configured to control the electronic switch SB based on the voltage at the first input node VIN1, the voltage at the second input node VIN2 and the voltage at the output node VOUT1.

Y4. The switching circuit of statement Y3, wherein the control circuitry comprises a comparator configured to generate a dependent voltage VD based on the voltage at the second input node VIN2 and the voltage at the first input node VIN1, to compare the dependent voltage VD with the voltage at the output node VOUT1 and to control the electronic switch SB based on the comparison.

Y5. The switching circuit of statement Y4, wherein:
the comparator comprises a first transistor Q1B, a second transistor Q2B, a third transistor Q3B, a first resistor R1B, a second resistor R2B, a third resistor R3B, a fourth resistor R4B, a voltage node VD and a voltage node GND, wherein an emitter of Q3B is connected to second input node VIN2, the base of Q3B is connected to first input node VIN1 via resistor R3B, a collector of Q3B is connected to voltage node GND via resistor R4B, the collector of Q3B is connected to the emitter of Q1B via the voltage node VD, an emitter of Q2B is connected to VOUT1, resistor R1B is connected between a collector of Q1B and the voltage node GND, resistor R2B is connected between a collector of Q2B and the voltage node GND, and a base of Q1B and a base of Q2B are connected to the collector of Q1B, wherein the voltage at the emitter of Q1B and at voltage node VD is the dependent voltage VD;
the voltage node GND represents a node at relatively low potential in comparison to VIN1, VIN2 and VOUT1; and the collector of Q2B is connected to the electronic switch SB to control the electronic switch SB based on the comparison.

Y6. The switching circuit of any of statements Y3 to Y5, wherein:
the electronic switch SB is a field-effect transistor SB whose channel is connected between the second input node VIN2 and the output node VOUT1; and
the control circuitry is configured to control the field-effect transistor SB based on the voltage at the first input node VIN1, the voltage at the second input node VIN2 and the voltage at the output node VOUT1,
optionally wherein the comparator is configured to control the field-effect transistor SB based on the comparison,
and further optionally wherein the collector of Q2B is connected to a gate terminal of the field-effect transistor SB to control the field-effect transistor SB based on the comparison.

Z1. A method of routing power between first and second input nodes VIN1, VIN2 for connection to respective first and second power supplies and an output node VOUT1 for connection to a load, the method comprising:
conductively connecting, via a first main switching circuit connected between the first input node VIN1 and the output node VOUT1, the first input node VIN1 to the output node VOUT1 if a voltage at the first input node VIN1 is higher than a voltage at the output node VOUT1; and
conductively connecting, via a first auxiliary switching circuit connected between the second input node VIN2 and the output node VOUT1, the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

Z2. The method of statement Z1, wherein the method further comprises conductively disconnecting, via the first main switching circuit, the first input node VIN1 from the output node VOUT1 if the voltage at the first input node VIN1 is lower than the voltage at the output node VOUT1.

Z3. The method of statement Z1 or Z2, wherein the method further comprises conductively disconnecting, via the first auxiliary switching circuit, the second input node VIN2 from the output node VOUT1 if the voltage at the second input node VIN2 is lower than the voltage at the output node VOUT1 or the voltage at the first input node VIN1 is not at least the threshold amount lower than the voltage at the second input node VIN2.

Z4. The method of any of statements Z1 to Z3, wherein the first main switching circuit comprises an electronic switch SA whose channel is connected between the first input node VIN1 and the output node VOUT1,
and wherein the method further comprises:
comparing the voltage at the first input node VIN1 with the voltage at the output node VOUT1; and
controlling the electronic switch SA based on the comparison.

Z5 The method of statement Z4, wherein:
the comparing the voltage at the first input node VIN1 with the voltage at the output node VOUT1 is performed by a comparator of the first main switching circuitry, the comparator of the first main switching circuit comprising a first transistor Q1A, a second transistor Q2A, a first resistor R1A, a second resistor R2A, and a voltage node GND, wherein the emitter of Q1A is connected to VIN1, an emitter of Q2A is connected to VOUT1, resistor R1A is connected between a collector of Q1A and the voltage node GND, resistor R2A is connected between a collector of Q2A and the voltage node GND, and a base of Q1A and a base of Q2A are connected to the collector of Q1A;

the voltage node GND represents a node at relatively low potential in comparison to VIN1 and VOUT1; and the collector of Q2A is connected to the electronic switch SA to control the electronic switch SA based on the comparison.

Z6. The method of statement Z4 or Z5, wherein:
the electronic switch SA is a field-effect transistor SA whose channel is connected between the first input node VIN1 and the output node VOUT1; and
the method further comprises controlling the field-effect transistor SA based on the comparison of the voltage at the first input node VIN1 with the voltage at the output node VOUT1,
and optionally wherein the collector of Q2A is connected to a gate terminal of the field-effect transistor SA, and wherein the method further comprises controlling the field-effect transistor SA based on the comparison of the voltage at the first input node VIN1 with the voltage at the output node VOUT1.

Z7. The method of any of statements Z1 to Z6, wherein the first auxiliary switching circuit comprises an electronic switch SB whose channel is connected between the second input node VIN2 and the output node VOUT1,
and wherein the method further comprises:
controlling the electronic switch SB based on the voltage at the first input node VIN1, the voltage at the second input node VIN2 and the voltage at the output node VOUT1.

Z8. The method of statement Z7, wherein the controlling the electronic switch SB comprises:
generating a dependent voltage VD based on the voltage at the second input node VIN2 and the voltage at the first input node VIN1, to compare the dependent voltage VD with the voltage at the output node VOUT1; and
controlling the electronic switch SB based on the comparison.

Z9. The method of statement Z8, wherein:
the generating a dependent voltage VD based on the voltage at the second input node VIN2 and the voltage at the first input node VIN1, to compare the dependent voltage VD with the voltage at the output node VOUT1 is performed by a comparator of the first auxiliary switching circuitry, the comparator of the first auxiliary switching circuit comprising a first transistor Q1B, a second transistor Q2B, a third transistor Q3B, a first resistor R1B, a second resistor R2B, a third resistor R3B, a fourth resistor R4B, a voltage node VD and a voltage node GND, wherein an emitter of Q3B is connected to second input node VIN2, the base of Q3B is connected to first input node VIN1 via resistor R3B, a collector of Q3B is connected to voltage node GND via resistor R4B, the collector of Q3B is connected to the emitter of Q1B via the voltage node VD, an emitter of Q2B is connected to VOUT1, resistor R1B is connected between a collector of Q1B and the voltage node GND, resistor R2B is connected between a collector of Q2B and the voltage node GND, and a base of Q1B and a base of Q2B are connected to the collector of Q1B, wherein the voltage at the emitter of Q1B and at voltage node VD is the dependent voltage VD;

the voltage node GND represents a node at relatively low potential in comparison to VIN1, VIN2 and VOUT1; and the collector of Q2B is connected to the electronic switch SB to control the electronic switch SB based on the comparison.

Z10. The method of any of statements Z7 to Z9, wherein:
the electronic switch SB is a field-effect transistor SB whose channel is connected between the second input node VIN2 and the output node VOUT1, and
the method further comprises controlling the field-effect transistor SB based on the voltage at the first input node VIN1, the voltage at the second input node VIN2 and the voltage at the output node VOUT1,
optionally wherein the method further comprises controlling the field-effect transistor SB based on the comparison,
and further optionally wherein the collector of Q2B is connected to a gate terminal of the field-effect transistor SB.

The invention claimed is:

1. A power routing circuit having first and second input nodes VIN1, VIN2 for connection to respective first and second power supplies and an output node VOUT1 for connection to a load, the power routing circuit comprising:
a first main switching circuit connected between the first input node VIN1 and the output node VOUT1 and configured to conductively connect the first input node VIN1 to the output node VOUT1 if a voltage at the first input node VIN1 is higher than a voltage at the output node VOUT1, wherein the first main switching circuit includes an electronic switch controlled by a voltage comparator that compares the voltages at VIN1 and VOUT1; and
a first auxiliary switching circuit connected between the second input node VIN2 and the output node VOUT1 and configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

2. The power routing circuit of claim 1, wherein the first main switching circuit is further configured to conductively disconnect the first input node VIN1 from the output node VOUT1 if the voltage at the first input node VIN1 is lower than the voltage at the output node VOUT1.

3. The power routing circuit of claim 1, wherein the first auxiliary switching circuit is further configured to conductively disconnect the second input node VIN2 from the output node VOUT1 if the voltage at the second input node VIN2 is lower than the voltage at the output node VOUT1 or the voltage at the first input node VIN1 is not at least the threshold amount lower than the voltage at the second input node VIN2.

4. The power routing circuit of claim 1, wherein the first main switching circuit comprises an electronic switch SA connected between the first input node VIN1 and the output node VOUT1, and a comparator configured to compare the voltage at the first input node VIN1 with the voltage at the output node VOUT1 and to control the electronic switch SA based on the comparison.

5. The power routing circuit of claim 4, wherein:
the comparator of the first main switching circuit comprises a first transistor Q1A, a second transistor Q2A, a first resistor R1A, a second resistor R2A, and a voltage node GND, wherein an emitter of Q1A is connected to VIN1, an emitter of Q2A is connected to VOUT1, resistor R1A is connected between a collector of Q1A and the voltage node GND, resistor R2A is connected between a collector of Q2A and the voltage node GND, and a base of Q1A and a base of Q2A are connected to the collector of Q1A;
the voltage node GND represents a node at relatively low potential in comparison to VIN1 and VOUT1; and
the collector of Q2A is connected to the electronic switch SA to control the electronic switch SA based on the comparison.

6. The power routing circuit of claim 1, wherein the first auxiliary switching circuit comprises an electronic switch SB connected between the second input node VIN2 and the output node VOUT1, and control circuitry configured to control the electronic switch SB based on the voltage at the first input node VIN1, the voltage at the second input node VIN2 and the voltage at the output node VOUT1.

7. The power routing circuit of claim 6, wherein the control circuitry of the first auxiliary switching circuit comprises a comparator configured to generate a dependent voltage VD based on the voltage at the second input node VIN2 and the voltage at the first input node VIN1, to compare the dependent voltage VD with the voltage at the output node VOUT1 and to control the electronic switch SB (220S) based on the comparison.

8. The power routing circuit of claim 7, wherein:
the comparator of the first auxiliary switching circuit comprises a first transistor Q1B, a second transistor Q2B, a third transistor Q3B, a first resistor R1B, a second resistor R2B, a third resistor R3B, a fourth resistor R4B, a voltage node VD and a voltage node GND, wherein an emitter of Q3B is connected to second input node VIN2, a base of Q3B is connected to first input node VIN1 via resistor R3B, a collector of Q3B is connected to voltage node GND via resistor R4B, the collector of Q3B is connected to an emitter of Q1B via the voltage node VD, an emitter of Q2B is connected to VOUT1, resistor R1B is connected between a collector of Q1B and the voltage node GND, resistor R2B is connected between a collector of Q2B and the voltage node GND, and a base of Q1B and a base of Q2B are connected to the collector of Q1B, wherein the voltage at the emitter of Q1B and at voltage node VD is the dependent voltage VD;
the voltage node GND represents a node at relatively low potential in comparison to VIN1, VIN2 and VOUT1; and
the collector of Q2B is connected to the electronic switch SB to control the electronic switch SB based on the comparison.

9. Power routing circuitry comprising a plurality of power routing circuits, each power routing circuit being a power routing circuit according to claim 1.

10. A power supply system with redundancy comprising the power routing circuit of claim 1, comprising a plurality of power routing circuits, each power routing circuit being a power routing circuit having first and second input nodes VIN1, VIN2 for connection to respective first and second power supplies and an output node VOUT1 for connection to a load, the power routing circuit comprising:
a first main switching circuit connected between the first input node VIN1 and the output node VOUT1 and configured to conductively connect the first input node VIN1 to the output node VOUT1 if a voltage at the first input node VIN1 is higher than a voltage at the output node VOUT1; and
a first auxiliary switching circuit connected between the second input node VIN2 and the output node VOUT1 and configured to conductively connect the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2, and a plurality of power supplies connected to respective input nodes of the power routing circuit or the power routing circuitry.

11. A method of routing power between first and second input nodes VIN1, VIN2 for connection to respective first and second power supplies and an output node VOUT1 for connection to a load, the method comprising:
conductively connecting, via a first main switching circuit connected between the first input node VIN1 and the output node VOUT1, the first input node VIN1 to the output node VOUT1 if a voltage at the first input node VIN1 is higher than a voltage at the output node VOUT1, wherein the first main switching circuit includes an electronic switch controlled by a voltage comparator that compares the voltages at the VIN1 and the VOUT1; and
conductively connecting, via a first auxiliary switching circuit connected between the second input node VIN2 and the output node VOUT1, the second input node VIN2 to the output node VOUT1 if a voltage at the second input node VIN2 is higher than the voltage at the output node VOUT1 and the voltage at the first input node VIN1 is at least a threshold amount lower than the voltage at the second input node VIN2.

* * * * *